United States Patent [19]

Hong et al.

[11] Patent Number: 5,605,724
[45] Date of Patent: Feb. 25, 1997

[54] METHOD OF FORMING A METAL CONDUCTOR AND DIFFUSION LAYER

[75] Inventors: Qi-Zhong Hong, Dallas; Robert H. Havemann, Garland, both of Tex.

[73] Assignee: Texas Instruments Incorporated, Dallas, Tex.

[21] Appl. No.: 407,353

[22] Filed: Mar. 20, 1995

[51] Int. Cl.[6] ........................................ H05H 1/00
[52] U.S. Cl. ........................ 427/535; 204/192.1; 427/124; 427/126.1; 427/404; 427/405; 427/419.7; 427/576; 427/585
[58] Field of Search ........................ 427/535, 576, 427/585, 124, 126.1, 405, 404, 419.7; 204/192.1

*Primary Examiner*—Bernard Pianalto
*Attorney, Agent, or Firm*—Jacqueline J. Garner; Richard L. Donaldson; William E. Hiller

[57] ABSTRACT

A method for minimizing reaction between metal conductors and other metals to minimize change in sheet resistance of the conductors upon heat treatment which includes providing a substrate. The substrate is preferably one of a dielectric, a metal or a semiconductor. A metallic diffusion barrier layer, preferably one of TiN, TiW or TiWN and preferably having a thickness of from about 10 nanometers to about 100 nanometers, is deposited on the substrate, preferably by one of sputtering, electron beam evaporation or chemical vapor deposition. The exposed surface of the metallic diffusion barrier layer is treated with a plasma, preferably an oxygen plasma, a nitrous oxide plasma or a plasma of an oxygen-containing species. An electrical conductor, preferably one of aluminum, aluminum-metal alloys, copper or copper-metal alloys and preferably having a thickness of from about 100 nanometers to about 1200 nanometers, is then deposited on the plasma-treated surface of the metallic diffusion barrier layer. The layers can be formed as one of a blanket or continuous films over the substrate. The conductor can then be patterned.

22 Claims, No Drawings

METHOD OF FORMING A METAL CONDUCTOR AND DIFFUSION LAYER

BACKGROUND OF THE INVENTION

1. Field of the Invention

This invention relates to the stabilization of the sheet resistance of Al-Cu alloy electrical conductors.

2. Brief Description of the Invention

Al-Cu alloy has been used as an electrical conductor in VLSI devices to take advantage of its low resistivity. However, Al-Cu alloy is quite active chemically and readily reacts with metals upon application of heat thereto, generally above 450° C. In order to circumvent this problem, TiN has been used as a diffusion barrier between Al-Cu alloy and other metals. However, post deposition heat treatment of the Al-Cu/TiN, such as spin-on-glass (SOG) cure, sintering, aluminum reflow and the like can increase the sheet resistance of, for example, Al-0.5%Cu (600 nm thickness)/TiN (50 nm thickness) by as much as fifteen percent. This poses a serious problem for devices where SOG (organic or inorganic) cure and aluminum reflow are used for dielectric planarization and via filling during fabrication.

Most of the prior art relating to the improvement of TiN barrier properties is directed to preventing diffusion of aluminum into active silicon devices or into tungsten vias. In the prior art, the improvement of TiN barriers has mostly been achieved by optimizing the deposition parameters during TiN deposition, such as, for example, introducing oxygen flow during deposition or changing the substrate tempaerature or adding a substrate voltage bias. Some post-deposition treatments, such as, for example, thermal annealing and exposure to air have also been reported.

The oxygen dosing during TiN deposition is not desirable because oxygen may contaminate the titanium sputtering target, form titanium oxide particles and increase the sheet resistance of TiN. Changing deposition temparature may induce change in other properties of TiN, such as stress and grain size, making it difficult to optimize these parameters at the same time. Adding substrate bias induces ion bombardment of the TiN layer this possibly resulting in radiation damage to the existing devices. Post-deposition treatment involves additional processing steps and hence increases the process cycle time. Moreover thermal annealing (densification) of TiN can only be accomplished at the contact level where Al-Cu alloy is not present. It has been determined by applicants that exposure of TiN to air for 24 hours does not improve the barrier properties.

SUMMARY OF THE INVENTION

In accordance with the present invention, the resistance of an electrical conductor, such as aluminum, copper and alloys thereof, such as, for example, Al-Cu alloy, is stabilized by the use of a plasma beam, preferably oxygen, after a metallic difusion barrier layer deposition thereon, preferably TiN, whereby the barrier properties of the TiN are improved. As a result, the sheet resistance of Al-Cu/TiN remains the same after thermal cycling. Advantages derived by this procedure are that, since the plasma treatment is not effected during TiN deposition, there is no contamination/particle problem as discussed above. Further, since the plasma is a low energy ion beam, sufficient to provide from about 30 to about 50 percent oxygen in the surface region of the metallic diffusion barrier layer, it only interacts with the surface region of the TiN to a depth of up to about 50 Å. Consequently, the bulk of the TiN still remains metallic and the sheet resistance of the TiN is not changed significantly. On the other hand, in the case of an oxygen plasma, for example, the surface region is believed to be a Ti-N-O layer at the surface of the TiN which is formed by the oxygen plasma/TiN interaction and is thick enough to block the reaction between Al-Cu alloy and TiN while at the same time thin enough to allow current tunneling. Still further, the plasma treatment can be conveniently performed in a resist ash chamber, which is available in the fabrication environment. The total ash time (plasma treatment time) can be very short (less than one minute), so the throughput is not severely compromised. If process integration is required, a separate oxygen plasma chamber can be readily added to the existing TiN sputtering system.

Briefly, the procedure in accordance with the present invention requires providing a substrate, preferably one of a dielectric, a metal or a semiconductor. A metallic diffusion barrier layer, preferably one of TiN, TiW or TiWN and preferably having a thickness of from about 10 nanometers to about 100 nanometers, is deposited on the substrate, preferably by one of sputtering, electron beam evaporation or chemical vapor deposition. The exposed surface of the metallic diffusion barrier layer is treated with a plasma, preferably an oxygen plasma, a nitrous oxide plasma or a plasma of an oxygen-containing species. An electrical conductor, preferably one of aluminum, aluminum-metal alloys, copper or copper-metal alloys and preferably having a thickness of from about 100 nanometers to about 1200 nanometers, is then deposited on the plasma-treated surface of the metallic diffusion barrier layer. The layers can be formed as one of a blanket or continuous films over the substrate. The electrical conductor and the diffusion barrier can then be patterned.

DESCRIPTION OF THE PREFERRED EMBODIMENT

A 50 nanometer thick layer of TiN was first deposited on several substrates of silicon dioxide. Then some of the substrates with the layer of TiN thereon were subjected to an oxygen plasma treatment in a resist ash chamber using a single, double and triple Gasonic process, using the Branson recipe for 30 and 60 minute time periods and with no ashing.

The Branson recipe is as follows:

| | |
|---|---|
| Oxygen | 650 SCCM (standard cubic centimeters) |
| RF Power | 1000 watts |
| Pressure | 1.15 Torr |
| Time | (see chart below) |

The Gasonic Process is as follows:

| | |
|---|---|
| Oxygen | 5 SCCM |
| Nitrous Oxide | 0.5 SCCM |
| Pressure | 1.75 Torr |
| RF Power | 1000 watts |
| Time | 50 seconds |

Then wafers with ash by each of the above procedured for the times listed in the chart below and without ash were covered with with a 600 nanometer thick layer of Al-0.5%Cu alloy by sputtering. The sheet resistance of the wafers was measured. After SOG cure heat treatment at 450° C. for one hour, the sheet resistance of the wafers was again measured and a comparison was made with the measured sheet resistance before the SOG cure. The resistance increase (RI) in percentage was tabultaed as follows:

| Ash Recipe | RI(TiN) | RI(Al—Cu/TiN) | Time |
|---|---|---|---|
| Single Gasonic | 10.6 | 0.35 | 50 seconds |
| Double Gasonic | 16.3 | 0 | 100 seconds |
| Triple Gasonic | 35.4 | 1.3 | 150 seconds |
| 30 min. Branson | 8.4 | 1.3 | 30 minutes |
| 60 min. Branson | 11.4 | 1.1 | 60 minutes |
| No ashing | 1.5 | 10.5 | |

It can be seen that plasma treatment or ashing resulted in a negligible increase in resistance as compared with no ashing.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modification.

We claim:

1. A method for minimizing reaction between a metal conductor and another metal to minimize change in sheet resistance of said conductor upon heat treatment, comprising the steps of:
   (a) providing a substrate;
   (b) depositing a diffusion barrier layer having a metal component on said substrate;
   (c) treating the exposed surface of said diffusion barrier layer with a plasma; and
   (d) depositing an electrical conductor on plasma treated surface of said diffusion barrier layer.

2. The method of claim 1 wherein a top portion of said substrate below said metal conductor is one of a dielectric, a metal, or a semiconductor.

3. The method of claim 1 wherein said diffusion barrier layer is one of TiN, TiW, or TiWN.

4. The method of claim 3 wherein said plasma is essentially one of an oxygen plasma, a nitrous oxide plasma or a plasma of an oxygen-containing species.

5. The method of claim 1 wherein said plasma is essentially one of an oxygen plasma, a nitrous oxide plasma or a plasma of an oxygen-containing species.

6. The method of claim 1 wherein said conductor is taken from the class consisting of aluminum, aluminum-metal alloys, copper and copper-metal alloys.

7. The method of claim 1 wherein said diffusion barrier layer is deposited by one of sputtering, electron beam evaporation or chemical vapor deposition.

8. The method of claim 7 wherein the thickness of said diffusion barrier layer is from.

9. The method of claim 8 wherein the thickness of said conductor is from about 100 nanometers to about 1200 nanometers.

10. The method of claim 9 wherein said plasma is an oxygen plasma providing from about 30 to about 50 percent oxygen in a surface region of said diffusion barrier layer having a thickness sufficient to substantially block reaction between said electrical conductor and said diffusion barrier layer up to about 50 Å.

11. The method of claim 9 wherein said layers are formed as one of a blanket or continuous films.

12. The method of claim 11 further including the step of patterning said conductor.

13. The method of claim 1 wherein the thickness of said conductor is from about 100 nanometers to about 1200 nanometers.

14. The method of claim 1 wherein the thickness of said diffusion barrier layer is from about 10 nanometers to about 100 nanometers.

15. The method of claim 1 wherein said layers are formed as one of a blanket or continuous films.

16. The method of claim 1 further including the step of patterning said conductor.

17. The method of claim 1 wherein said plasma is an oxygen plasma providing from about 30 to about 50 percent oxygen in a surface region of said diffusion barrier layer having a thickness sufficient to substantially block reaction between said electrical conductor and said diffusion barrier layer up to about 50 Å.

18. A method for forming a combined metal conductor and diffusion barrier layer having stabilized sheet resistance upon heat treatment, comprising the steps of:
   providing a substrate;
   forming a diffusion barrier layer by depositing a diffusion barrier material having a metal component on said substrate;
   treating an exposed surface of said diffusion barrier layer with a plasma;
   depositing a metal layer on said plasma treated exposed surface; and
   etching said metal layer to form said metal conductor.

19. The method of claim 18, wherein said diffusion barrier layer comprises a material selected from the group consisting of TiN, TiW, and TiWN.

20. The method of claim 18, wherein said plasma is an oxygen plasma.

21. The method of claim 18, wherein said plasma is an oxygen plasma providing from about 30 to about 50 percent oxygen in a surface region of said diffusion barrier layer, said surface region having a thickness sufficient to substantially block reaction between said electrical conductor and said diffusion barrier layer up to about 50 Å.

22. The method of claim 18, wherein said diffusion barrier layer has a thickness in the range of 10-100 nanometers.

* * * * *